United States Patent

[11] 3,582,830

[72] Inventors Jerzy Pultorak;
Michal Rzewuski, both of Warszawa, Poland

[21] Appl. No. 757,606
[22] Filed Sept. 5, 1968
[45] Patented June 1, 1971

[73] Assignee Polska Akademia Nauk, Instytut Technologii Elektronowej Warszawa, Poland

[32] Priority Sept. 8, 1967, Sept. 12, 1967
[33] Poland
[31] P122507 and P122522

[54] SEMICONDUCTOR DEVICE INTENDED ESPECIALLY FOR MICROWAVE PHOTODETECTORS
3 Claims, 5 Drawing Figs.

[52] U.S. Cl. .......... 332/52, 317/234, 317/235
[51] Int. Cl. .......... H03c 1/00, H03c 1/14, H03c 1/34
[50] Field of Search .......... 317/235/48.1, 234/9, 235/28, 234/10, 235/27; 333/84; 332/52

[56] References Cited
UNITED STATES PATENTS

| | | | |
|---|---|---|---|
| 3,436,613 | 4/1969 | Gerhard et al. | 317/234 |
| 3,302,266 | 2/1969 | Grace | 29/25.3 |
| 3,366,805 | 1/1968 | Bear | 307/261 |
| 3,284,676 | 11/1966 | Izumi | 317/234 |
| 3,324,358 | 6/1967 | Memelink | 317/235 |
| 3,458,832 | 7/1969 | McGroddy et al. | 331/107 |

*Primary Examiner*—John W. Huckert
*Assistant Examiner*—Martin H. Edlow
*Attorney*—Irvin A. Lavine

ABSTRACT: A semiconductor device having a lightly doped central region flanked by two heavily doped regions, all of the same conductivity type, with ohmic contacts to the heavily doped regions for applying bias voltage to the device. The thickness of the lightly doped region is less than the diffusion length of minority carriers therein, and the thickness of the heavily doped regions is greater than the diffusion length of the minority carriers therein. Light of varying amplitude applied to the lightly doped region is detected.

Figures 1, 2, 3:
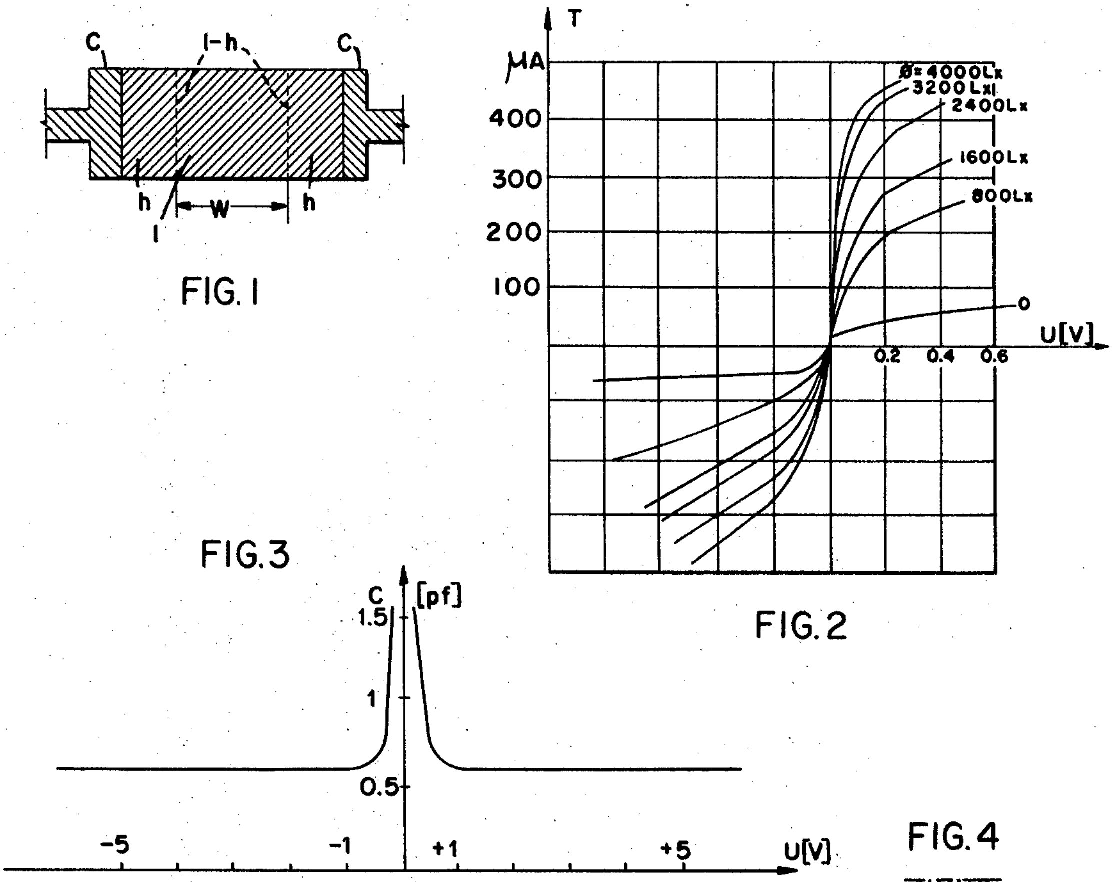

*INVENTORS*
JERZY PULTORAK
MICHAL RZEWUSKI

SEMICONDUCTOR DEVICE INTENDED ESPECIALLY FOR MICROWAVE PHOTODETECTORS

The present invention relates to a semiconductor device, intended especially for microwave photodetectors and also for conventional photodetection systems, involving simple fabrication processes and providing good photoelectric properties. The operation of the device makes use of 1–*h* junction characteristics. 1–*h* type junctions are junctions which are formed between two regions of semiconductor material of the same type of conductivity (*n*or *p*) but of different concentrations, the highly doped regions being given the notation *h* and the lightly doped region being given the notation 1. In known structures of semiconductor diodes, 1–*h* junctions are the elements which operate in conjunction with PN junctions. Diodes of logarithmic current-voltage characteristics disclosed in Polish Pat. No. 48976, of power-law relation between forward current and voltage, as well as high frequency photodiodes are devices which are constructed on this principle.

Presently known microwave photodetectors such as those developed by RCA Laboratories, Princeton, N.J., are laboratory-made devices. The semiconductor samples made to be mounted in a microwave resonator were made in the form of thin wafers of small surface areas. These thin monocrystalline wafers were made by lapping and etching them to a thickness of less than 25 μm. Two methods of mounting the semiconductor samples in the resonator were used: in the first method the sample was cemented to one end of the cavity center post, while in the second method the sample was cemented to a small block of sapphire which in turn was cemented to the cavity center post. The sample dimensions for one of the experimental arrangements have been reported to be 10×25×25 μm.

The proper operation of a microwave photodetector made in this manner involves very high accuracy in making the sample and mounting it in a resonator, which results in considerable technological difficulties.

It is an object of the present invention to provide a semiconductor device for microwave photodetection wherein the above mentioned difficulties connected with the fabrication of the device and with the mounting of it in the photodetector will be avoided or reduced.

The inventions provides a semiconductor device intended especially for microwave photodetectors including two 1–*h* junctions of similar dimensions. The thickness of the 1 region between these junctions is less than the diffusion length of the minority carriers within this region. Both of the *h* regions have their thicknesses larger than the diffusion lengths of the minority carriers within these regions and are provided with low-resistance ohmic contacts.

The device can be mounted in a cavity, in either of the following ways: either it is mounted directly in a microwave cavity where the device is subject to electromechanical processing consisting in etching-off the superfluous part of the wafer, or the device can be made in a separate holder and then mounted in the cavity.

Figure 4:
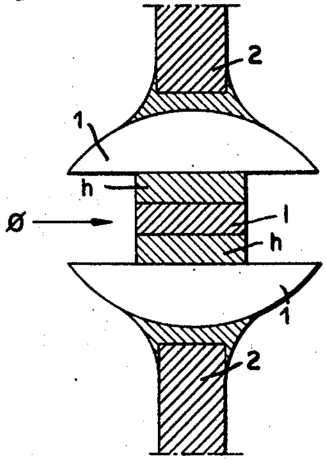
Figure 5:
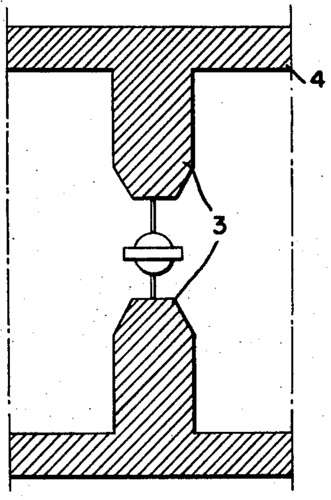

An embodiment of the invention will now be described by way of example, with reference to the accompanying drawings, in which: fig. 1 is a schematic diagram of the device according to the invention; FIG. 2 shows the current-voltage characteristics of the device with light flux as a parameter; FIG. 3 shows the capacitance-voltage characteristic of the device; FIG. 4 shown an example of the photoelectric device after electrochemical processing; and FIG. 5 shows the way of mounting the device in a cavity.

The device shown schematically in FIG. 1 consists of semiconductor region 1 of high specific resistance and thickness W less than the diffusion length of the minority carriers within this region. This region 1 is flanked by two *h* regions of highly doped semiconductor material of the same conductivity type. Thus, a device is formed having two 1–*h* junctions. The *h* regions have their thickness larger than the respective diffusion lengths of minority carriers and are provided with low-resistance ohmic contacts C.

The semiconductor device with two 1–*h*junctions provides a symmetrical nonlinear current-voltage characteristic and offers photoelectric properties as shown in FIG. 2. This figure shows the current-voltage characteristic curves for different values of light flux Φ. The slope of the characteristic curves within the range of very small biasing voltages results from the specific resistance of the 1 region and geometrical dimensions of the device and decreases as the bias voltage increases. Moreover, the device shows a symmetrical nonlinear capacitance-voltage characteristic as shown in FIG. 3, the capacitance value decreasing with the increase of bias.

FIG. 4 shows a photoelectric device after electrochemical treatment which has removed superfluous bulk of the 1 and *h* regions of the semiconductor wafer from between contacts 1. These contacts are shown connected to leads 2, as by soldering, brazing or welding. Light impingement on the 1 region, which is the center and is lightly doped, is indicated by the light flux symbol Φ and the arrow extending therefrom and directed to the region 1. The leads 2 are the means by which the above noted bias voltage is applied to the device.

The photoelectric device with two 1–*h*junctions may be directly mounted in a cavity as shown in FIG. 5, with leads 2 being connected to the center posts 3 of the cavity, and then subjected to an electrochemical treatment to remove the superfluous part of the wafer.

The semiconductor device with two 1–*h* junctions is placed in the region of maximum microwave electric field in a cavity. The frequency of the microwave field must be so high that the photoconductor bias reversal occurs before the photocarriers can leave the semiconductor region 1. Then the photocarriers move back and forth in the semiconductor for the duration of the lifetime of the carriers. This phenomenon, in a microwave circuit, will appear as the effect of amplification of an electric signal developed as the result of light detection. In such a circuit, the changes in the amplitude of incident light will result in microwave signal amplitude modulation with the said amplification effect taking place. Thus, the information superimposed on the optical signal will be transferred onto the microwave signal. Conventional means are then used to demodulate the microwave signal. As far as the information bandwidth transmittable by the circuit is concerned, this is restricted by the lifetime of carriers in the semiconductor employed and by the band-pass of the cavity in which the semiconductor had been placed. Theoretically, the maximum gain available in such an arrangement is:

$$G_{max}=AQf_p/f_{imax}$$

where:

$G_{max}$—maximum circuit gain $f_p$—microwave signal frequency $f_{imax}$—maximum frequency of information bandwidth.

The sensitivities achievable are of the order of those of photomultipliers. The above-described arrangement may also be used for wavelengths larger than 1 μm. depending on the semiconductor type used. As is known, all photoemissive devices, including photomultipliers respond only to wavelengths of less than about 1 μm. The fabrication of the microwave photodetector by the method according to the invention is very simple the degree of difficulties and cost of making such a device approximate to those encountered in producing ordinary alloy-type transistors.

In addition, the surface of the device provides, due to the electrochemical treatment, a very low value of carrier recombination rate thus giving an improvement in photoelectric properties of the microwave photodetector.

We claim:

1. A semiconductor device comprising:

a body of semiconductor material having a lightly doped region and two heavily doped regions, said heavily doped regions being on either side of said lightly doped region with a junction between each two adjacent regions, said regions being of the same conductivity type, ohmic contact means on said two heavily doped regions for applying an electric signal of microwave frequency to said device, the thickness of the lightly doped regions being less than the diffusion length of minority carriers therein, the thickness of each said heavily doped region being of a thickness greater than the minority carriers therein light means of varying amplitude impinging upon said lightly doped region for modulating the signal amplitude.

2. The device of claim 1, and a microwave resonator, said device being mounted in said resonator.

3. The device of claim 2, said device being mounted in a holder, said holder being mounted in said resonator.